United States Patent [19]

Kim

[11] Patent Number: 5,247,482
[45] Date of Patent: Sep. 21, 1993

[54] SEMICONDUCTOR MEMORY DEVICE WITH HIGH SPEED WRITE OPERATION

[75] Inventor: Myoung-Ho Kim, Suwon, Rep. of Korea

[73] Assignee: SamSung Electronics Co., Ltd., Suwon, Rep. of Korea

[21] Appl. No.: 723,257

[22] Filed: Jun. 28, 1991

[30] Foreign Application Priority Data

May 24, 1991 [KR] Rep. of Korea .................. 1991-8455

[51] Int. Cl.$^5$ ............................................. G11C 7/00
[52] U.S. Cl. ..................... 365/203; 365/202; 365/149
[58] Field of Search ..................... 365/202, 203, 149

[56] References Cited

U.S. PATENT DOCUMENTS

| | | | |
|---|---|---|---|
| 4,736,343 | 4/1988 | Hidaka et al. | 365/203 |
| 4,792,928 | 12/1988 | Tobita | 365/202 |
| 4,813,022 | 3/1989 | Matsui et al. | 365/203 |
| 5,036,492 | 7/1991 | Runaldue | 365/202 |

*Primary Examiner*—John S. Heyamn
*Attorney, Agent, or Firm*—Robert E. Bushnell

[57] ABSTRACT

A dynamic RAM for performing high speed write operation after performing read operation. The inventive device receives write data after pre-charging and equalizing a pair of bit lines, by using a equalization signal activated for a predetermined time, at a time point at which a write enabling signal begins to be activated. Provided between the bit lines is an equalization circuit having an NMOS transistor of which gate is connected to the equalization signal depending on the write enabling signal.

8 Claims, 3 Drawing Sheets

SEMICONDUCTOR MEMORY DEVICE WITH HIGH SPEED WRITE OPERATION

BACKGROUND OF THE INVENTION

The present invention concerns a semiconductor memory device, and particularly a dynamic random access memory (RAM) having improved write function.

In a dynamic RAM, data stored in a memory cell selected by an address are loaded as a voltage on a bit line, while a charge stored in a dummy cell (or pre-charge voltage) is loaded on a complementary bit line as a reference voltage with respect to the voltage of the bit line. The voltage difference between the bit line and the complementary bit line is sufficiently amplified by a sense amplifier, etc., and then read out through input/output lines and a data output buffer. In addition to above the read function, the dynamic RAM performs write function for storing data in a memory cell selected by an address. During the write function, the potentials of the bit line lines are determined by the potential of data supplied through a data input buffer. Such dynamic RAM performing the read/write function is disclosed in the known technical references, and FIG. 1A shows a typical column circuit of such a conventional dynamic RAM.

Referring to FIGS. 1A and 1B, FIG. 1A illustrates the column circuit and FIG. 1B illustrates operational timing diagrams according to FIG. 1A. A bit line equalization circuit 10 connected to a bit line pre-charge voltage $V_{BL}$ of the level ($\frac{1}{2}$)VCC equalizes a pair of bit lines BL and $\overline{BL}$ into the level of ($\frac{1}{2}$)Vcc in response to an equalization signal EQ, during a row address strobe signal $\overline{RAS}$ being pre-charged at "high" state. On the other hand, the equalization signal EQ is disabled and a memory cell 20 connected to a word line WL is selected, during the $\overline{RAS}$ being active at "low" state. Then, the charge stored in the memory cell 20 is discharged to the bit line BL, and the charge stored in a dummy cell which is not shown is discharged to the complementary bit line $\overline{BL}$ (or maintaining the pre-charged level). Thereafter, as a sense amplifier 30 including two PMOS transistors and two NMOS transistors is operated according to sensing clock pulses LA and $\overline{LA}$, the voltage difference between the bit line BL and the complementary bit line $\overline{BL}$ is more amplified. The amplified data R1 is delivered to a pair of input/output lines IO and $\overline{IO}$, through a column gate 50 driven in response to a column selection signal CSL which is enabled according to a column address strobe signal $\overline{CAS}$. The input/output lines are generally equalized to a higher level which is, for example, dropped by the threshold voltage of the MOS transistor from the source voltage Vcc, than the equalization level of the bit lines. After reading out the data R1, the bit lines are again equalized by the equalization signal EQ. Then, when a new read data R2 is read out in like manner and a write enabling signal $\overline{WE}$ activated, the potential of the bit line pair BL, $\overline{BL}$ is determined according write data W which is externally supplied thereto. Normally, the potential difference of the bit line pair is substantially identical to the source voltage level. In the event that the bit lines are connected to the input/output lines through the column gate 50 which is turned on by the column selection signal CSL at "high" state, the potentials on the bit line BL and the complementary bit line $\overline{BL}$ are then transmitted. Hence, a considerable transition time is required until the input data on the input/output lines is sufficiently transferred to the bit lines, thus resulting in an undesirable delay of the writing time.

When the potentials of the bit lines have the swinging width as much as the source voltage level during the read-write transition, as in prior art, noises are produced in response to the swing width. Furthermore, since the self-resistance of the long bit lines in a high integrated memory device is higher, an influence according to noises is increased.

SUMMARY OF THE INVENTION

It is an object of the present invention to provide a circuit for reducing the writing time of a semiconductor memory device.

It is another object of the present invention to provide a circuit for performing the write function promptly and effectively after the read function being performed.

According to an aspect of the present invention, a semiconductor memory device performing read and write functions in response to an external control signal, includes a pair of bit lines connected between memory cell and a pair of input/output lines for transmitting therethrough data during reading and writing functions, a write equalization circuit connected between the bit lines receiving an equalization voltage of a given level and being controlled in response to a write equalization signal depending on a write enabling signal, an equalization selecting circuit being controlled by a column selection signal and for transferring the equalization signal to the write equalization circuit, column gates respectively connected between the input/output lines and the bit lines and being controlled by the column selection signal, and a circuit receiving a column address signal and the write enabling signal, for generating the write equalization signal, whereby the equalization signal is activated for a given, at a time point at which the write enabling signal begins to be activated.

BRIEF DESCRIPTION OF THE ATTACHED DRAWINGS

For a better understanding of the invention and to show how the same may be carried into effect, reference will now be made, by way of example, to the accompanying diagrammatic drawings, in which.

DETAILED DESCRIPTION OF A PREFERRED EMBODIMENT

Figure 1A:
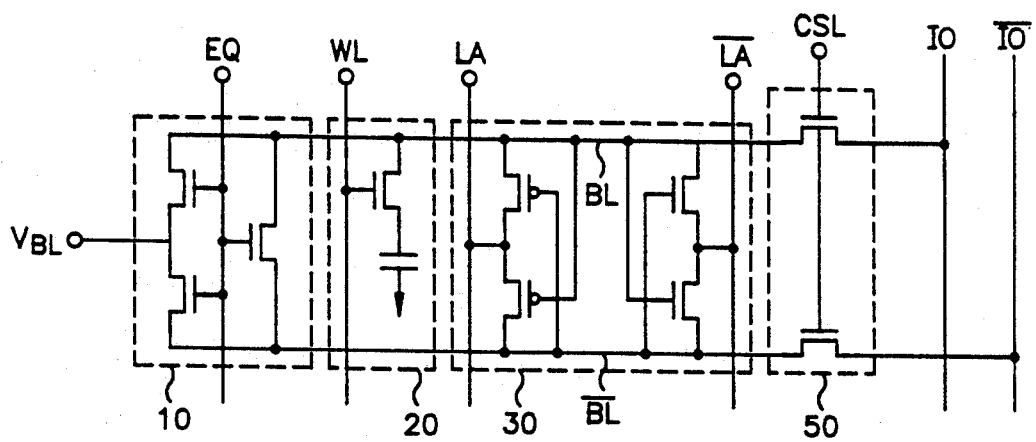
FIG. 1A is a column circuit of a conventional dynamic RAM.
Figure 1B:
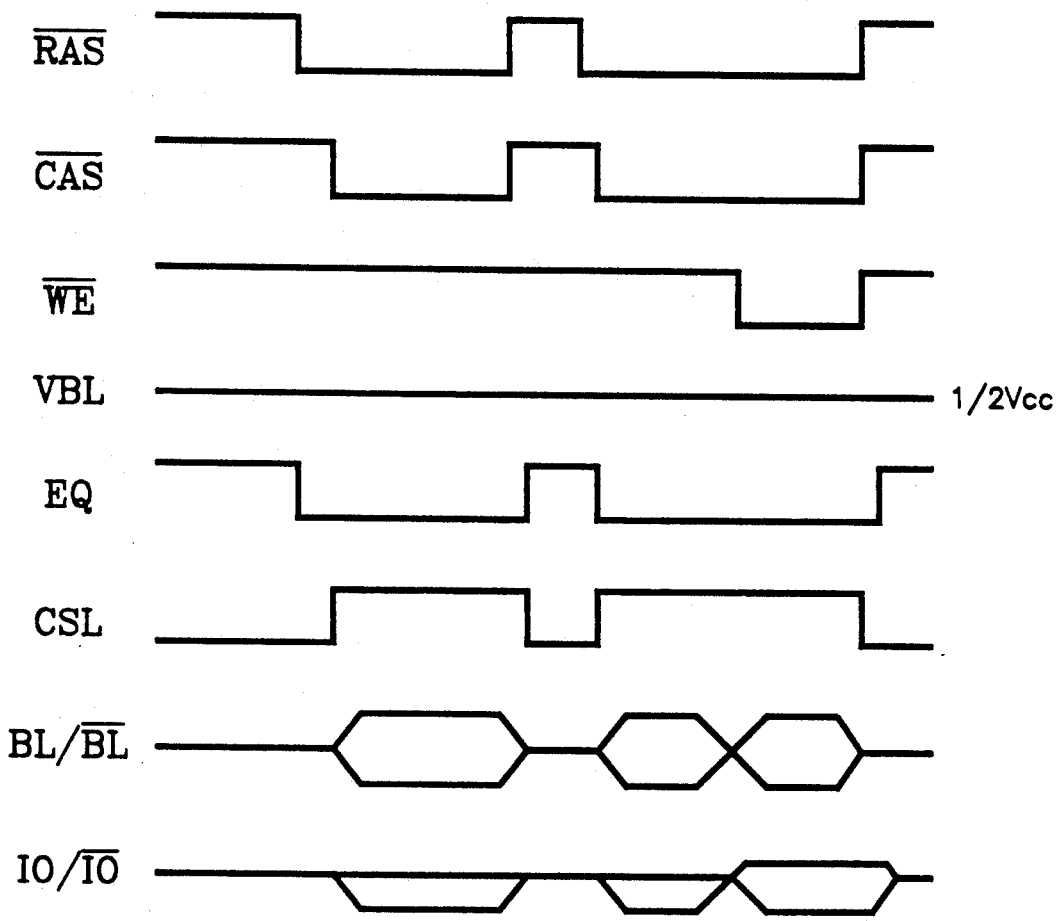
FIG. 1B is an operational timing diagrams of FIG. 1A.
Figure 2:
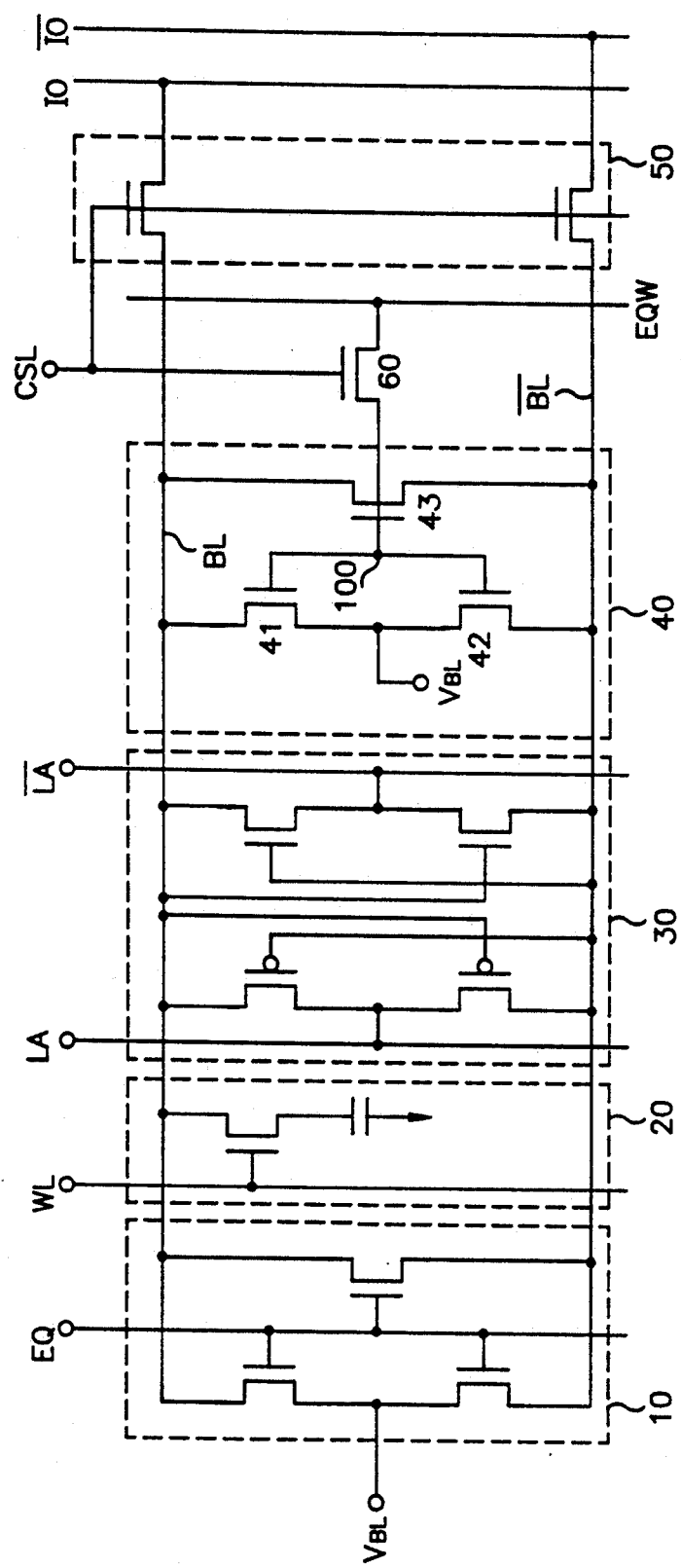
FIG. 2 is a column circuit of a dynamic R according to the present invention.

Referring to FIG. 2, a column circuit includes an equalization circuit 10, memory cell 20, sense amplifier 30 and column gate 50, which correspond to a conventional column circuit of FIG. 1A. A write equalization circuit 40 having NMOS transistors 41, 42, 43 is connected between a bit line BL and a complementary bit line $\overline{EL}$. The channels of the NMOS transistors 41 and 42 are connected in series between the bit line pair BL and $\overline{BL}$, and the gates thereof are commonly connected to a node 100. The connection of the channels of the transistors 41 and 42 is supplied with a voltage $V_{BL}$ of the level (½) Vcc. The channel of the NMOS transistor 43 is connected between the bit lines BL and $\overline{BL}$, and the gate thereof is connected to the node 100. The node 100 commonly connecting the gates of the transistors 41, 42, 43, is connected to write equalization signal EQW through an equalization selecting NMOS transistor 60. A column selection signal CSL is supplied to both the gate of the selecting NMOS transistor 60 and the column gate 50. The selecting NMOS transistor 60 causes the write equalization signal EQW to be applied to the node 100 before performing the write function, thus equalizing the bit lines to the equalization voltage $V_{BL}$. The write equalization signal EQW depends on the write enabling signal $\overline{WE}$ and the column address strobe signal $\overline{CAS}$.

Figure 3A:
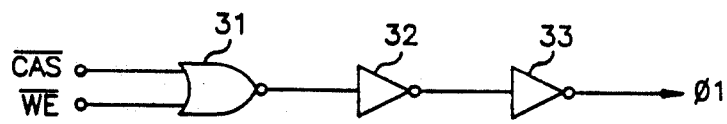
FIG. 3 illustrates circuits for generating control signals used for the present invention.
Figure 3B:
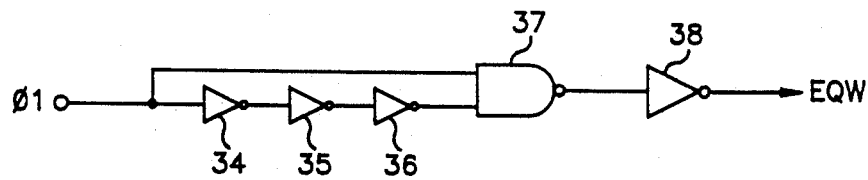
Figure 4:
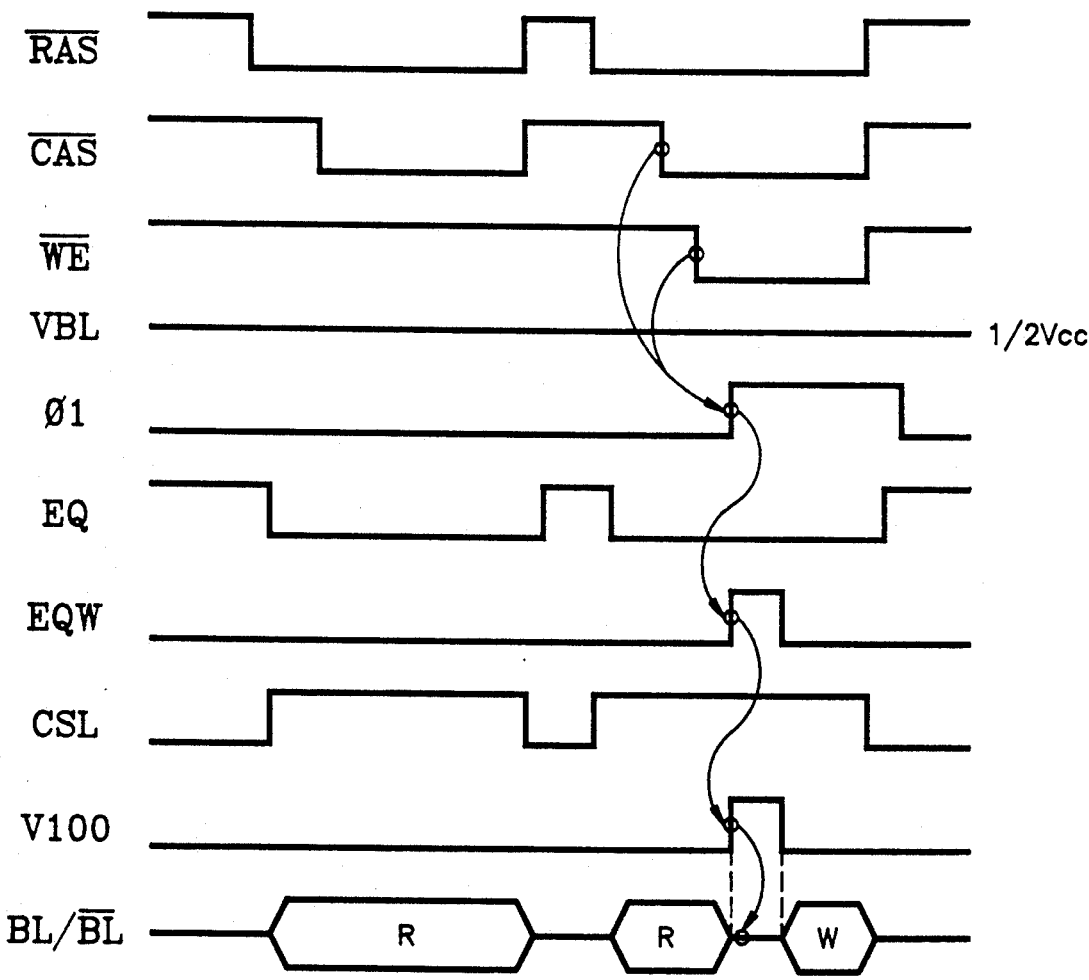
FIG. 4 is an operational timing diagrams according to the present invention.

Referring to FIGS. 3A and 3B, they illustrate the gate circuit for generating the write equalization signal EQW and clock pulses $\phi 1$. The clock pulses $\phi 1$ are produced, by a NOR gate receiving the column address strobe signal $\overline{CAS}$ and the write enabling signal $\overline{WE}$, and inverters 32 and 33 for shaping the signal output from the NOR gate 31, as shown in FIG. 3A. The clock pulses $\phi 1$, of which pulse width is adjusted by inverters 34, 35 and 36 and a NAND gate 37, are delivered as the write equalization signal EQW through an inverter 38, as shown in FIG. 3B. In this case, the gate circuit of FIGS. 3A and 3B may be constructed in various ways. FIG. 4 shows operational timing diagrams according to the present invention.

Hereinafter, the write operation in accordance with the present invention will be described referring to FIGS. 2 to 4.

If the column address strobe signal $\overline{CAS}$ and the write enabling signal $\overline{WE}$ are activated at "low" states as shown in FIG. 4, the clock pulse $\phi 1$ at "high" state is generated as shown in FIG. 3A. Then, the write equalization signal EQW of which pulse width is more narrow, applied to the channel of the selecting transistor 60. Since the column selection signal CSL is activated, the selecting transistor 60 and the column gate 50 are simultaneously turned on. The bit lines are equalized to the equalization voltage $V_{BL}$ which is (2/1)Vcc, by the NMOS transistors 41, 42, 43 of the write equalization circuit 40 being turned on, while the write equalization signal EQW is at "high" state. Thereafter, if the write equalization signal EQW becomes "low" state, the node 100 is discharged so as to turn off the transistors 41, 42, 43 of the write equalization circuit 40 and to split the potential of the bit lines according to the potential of the input data loaded on the input/output lines, to thereby be transferred the write data to selected memory cell.

Although an NMOS transistor is used as the selecting transistor in the present embodiment, other kind of semiconductor device may be used in technical scope of the present invention. According to the embodiment of the inventive device, the write operation time is reduced to 6 to 7 nanoseconds from 11 to 12 nanoseconds of the conventional device under the condition of 4Volt/80° C.

As stated above, the device according to the present invention quickly equalizes the bit lines and writes the input data after performing the read function, to thereby reduce the writing time and prevent the noise of the bit lines.

While the invention has been particularly shown and described with reference to a preferred embodiment, it will be understood by those skilled in the art that modifications in detail may be made without departing from the spirit and scope of the invention.

What is claimed is:

1. A semiconductor memory device performing read and write functions in response to an external control signal, comprising:

a pair of bit lines connected between a memory cell and a pair of input/output lines, for transmitting data therethrough during the reading and writing functions;

write equalization means controllable in response to a write equalization signal depending on a write enabling signal, said write equalization means connected between said bit lines receiving an equalization voltage at a given level;

equalization selecting means for transferring said write equalization signal to said write equalization means, said equalization selecting means being controlled in response to a column selection signal;

column gate means connected between said input/output lines and said bit lines, said column gate means being controlled in response to said column selection signal; and means receiving a column address signal and said write enabling signal, for generating said write equalization signal, whereby said write equalization signal is activated for a predetermined time, at a time point at which said write enabling signal begins to be activated.

2. A semiconductor memory device as claimed in claim 1, wherein said equalization selecting means comprises an insulating gate field effect transistor, a first terminal of channel of said transistor being connected to said write equalization signal, a second terminal of the channel of said transistor to said write equalization means, and the gate of said transistor being connected to said column selection signal.

3. A semiconductor memory device as claimed in claim 1 or 2, wherein said write equalization means comprises first, second and third metal-oxide-semiconductor (MOS) transistors, channels of said first and second MOS transistors being connected in series between said bit lines, said equalization voltage being applied a node formed at a connection of the channels of said first and second MOS transistors, gates of said first to third MOS transistors being commonly connected to said second terminal of the channel of said insulating gate field effect transistor.

4. A semiconductor memory device as claimed in claim 1, wherein said generating means comprises at least a logic gate, said logic gate having a first input terminal for receiving input signal without delay and a second input terminal for receiving said input signal with delay for a predetermined time.

5. A semiconductor memory device for transmitting external input data through a pair of bit lines to a selected memory cell, comprising:

a first and second NMOS transistors having channels connected in series between said bit lines and gates connected to each other, an equalization voltage of a given level being applied to a connection of said channels thereof;

a node commonly connected between said gates of said first and second NMOS transistors; and a third NMOS transistor having a first channel terminal connected to a write equalization signal, a second channel terminal connected to said node, and a gate connected to a column selection signal.

6. A semiconductor memory device as claimed in claim 5, further comprising an NMOS transistor having a channel connected between said bit lines and a gate connected to said node.

7. A semiconductor memory device as claimed in claim 5, wherein said column selection signal controls column gate means connected between said bit lines and input/output lines.

8. A semiconductor memory device as claimed in claim 5, wherein said write equalization signal is activated for a predetermined time, at a time point at which said write enabling signal begins to be activated.

* * * * *

UNITED STATES PATENT AND TRADEMARK OFFICE
CERTIFICATE OF CORRECTION

PATENT NO. : 5,247,482
DATED : 21 September 1993
INVENTOR(S) : Myoung-Ho Kim

It is certified that error appears in the above-indentified patent and that said Letters Patent is hereby corrected as shown below:

Column 1,

Line 32,    change "VCC" to --Vcc--;

Column 2,

Line 53,    change "R" to --RAM--; and

Line 68,    change "$\overline{EL}$" to --$\overline{BL}$--.

Signed and Sealed this

Sixth Day of September, 1994

Attest:

BRUCE LEHMAN

*Attesting Officer*    *Commissioner of Patents and Trademarks*